(12) United States Patent
Kimmlingen

(10) Patent No.: US 8,643,370 B2
(45) Date of Patent: Feb. 4, 2014

(54) FLOW SENSOR FOR COOLING WATER IN A GRADIENT COIL

(75) Inventor: Ralph Kimmlingen, Zirndorf (DE)

(73) Assignee: Siemens Aktiengellschaft, München (DE)

( * ) Notice: Subject to any disclaimer, the term of this patent is extended or adjusted under 35 U.S.C. 154(b) by 374 days.

(21) Appl. No.: 13/005,351

(22) Filed: Jan. 12, 2011

(65) Prior Publication Data
US 2011/0167924 A1 Jul. 14, 2011

(30) Foreign Application Priority Data
Jan. 14, 2010 (DE) .......................... 10 2010 004 664

(51) Int. Cl.
G01V 3/00 (2006.01)

(52) U.S. Cl.
USPC .......................................... 324/318; 324/322

(58) Field of Classification Search
USPC ................................ 324/318, 322; 73/861.78
See application file for complete search history.

(56) References Cited

U.S. PATENT DOCUMENTS

| | | | | |
|---|---|---|---|---|
| 5,115,684 A * | 5/1992 | Haeussler | ................... | 73/861.48 |
| 6,397,686 B1 * | 6/2002 | Taivalkoski et al. | ........ | 73/861.78 |
| 7,570,058 B1 * | 8/2009 | Wong et al. | .................... | 324/318 |
| 8,188,741 B2 * | 5/2012 | Sakakura | ...................... | 324/318 |
| 2006/0066309 A1 | 3/2006 | Arik et al. | | |

FOREIGN PATENT DOCUMENTS

| DE | 101 15 900 A1 | 12/2001 |
|---|---|---|
| DE | 103 14 215 B4 | 11/2006 |

OTHER PUBLICATIONS

German Office Action dated Oct. 21, 2010 for corresponding German Patent Application No. DE 10 2010 004 664.7-54 with English translation.

* cited by examiner

Primary Examiner — Louis Arana
(74) Attorney, Agent, or Firm — Lempia Summerfield Katz LLC

(57) ABSTRACT

A cooling water measurement system for a gradient system of an imaging system, such as a magnetic resonance system, is provided. A volume of cooling water flowing through at least one gradient system cooling water tube of the gradient system per unit of time is determined. The gradient system cooling water measurement system includes a voltage measurement system for measuring a Hall voltage.

21 Claims, 2 Drawing Sheets

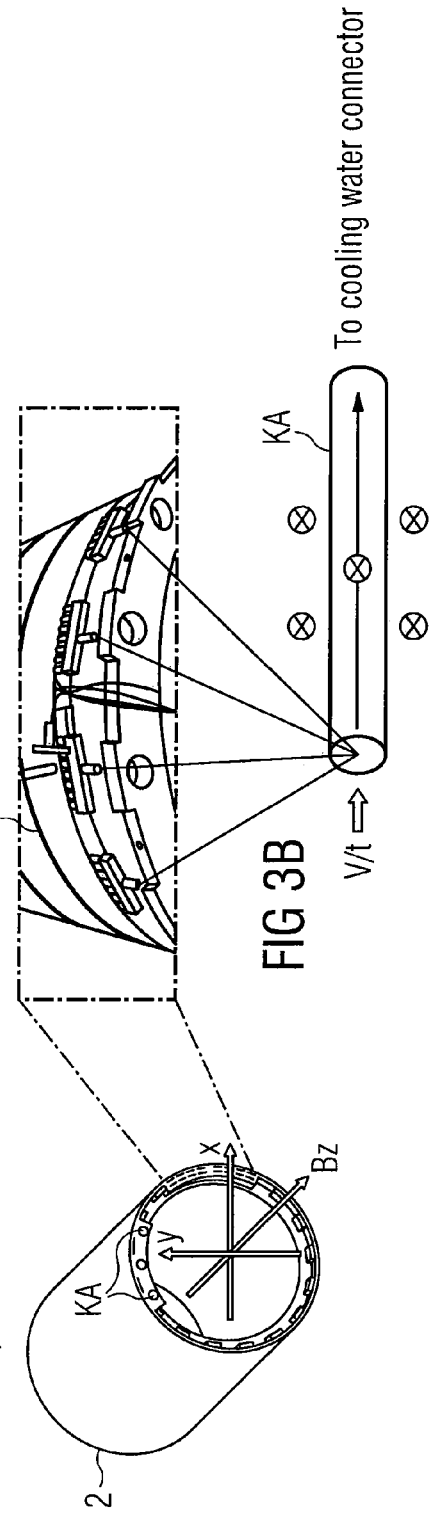
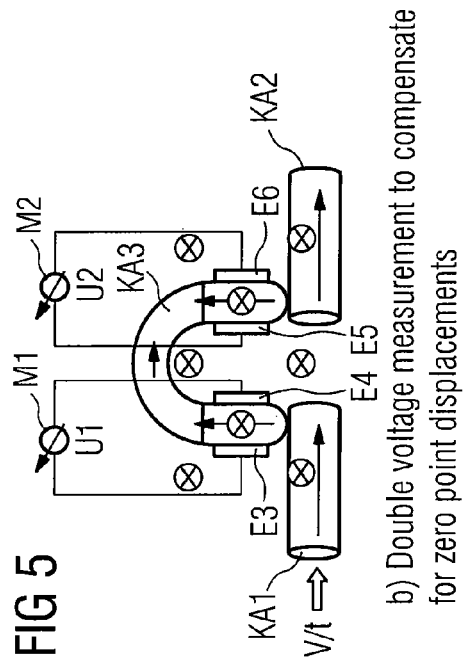
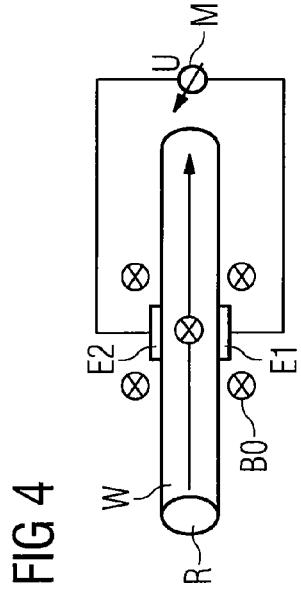

FLOW SENSOR FOR COOLING WATER IN A GRADIENT COIL

This application claims the benefit of DE 10 2010 004 664.7, filed Jan. 14, 2010.

BACKGROUND

The present embodiments relate to a method and apparatus for measuring cooling water in a gradient coil of an imaging system.

Magnetic resonance devices for examining objects or patients using magnetic resonance tomography are known, for example, from DE 10 314 215 B4.

Modern magnetic resonance systems (MRT) operate with coils to transmit high-frequency pulses for the nuclear resonance excitation and/or receiving of induced magnetic resonance signals. A magnetic resonance system may include a permanent magnet or (more frequently) a superconducting coil to generate an approximately homogenous basic magnetic field (H0) in an examination region, a large whole body coil (e.g., a body coil or BC) that may be integrated in a fixed manner in the MR device, and a number of small local coils (e.g., surface coils or LC). To read out information, from which images of a patient may be generated, selected regions of the object or patient to be examined are scanned using gradient coils for three axes (e.g., X, Y approximately radial to the patient and Z in the longitudinal direction of the patient). Local coding in magnetic resonance tomography may be realized with the aid of a gradient coil arrangement with three independently activatable magnetically orthogonal gradient field coil systems. By superimposing the three freely scalable fields (e.g., in three directions X, Y, Z) the orientation of the coding plane (e.g., gradient field) may be freely selected.

Gradient field coils according to the known prior art are operated with large currents (e.g., up to 1 kA) and major continuous power losses (e.g., approximately 30 kW). The specified nominal gradient amplitude may therefore only be produced, if the characteristics of water cooling correspond to expected values.

The water temperature upstream and downstream of the cooling circuit is measured, and the cooling water flowing from a number of cooling planes is determined. If the characteristics are outside the tolerance range, irreparable damage may occur at the gradient coil.

The prior art involves integrating an indirect volume counter in a chiller cabinet (e.g., a turbine throughflow meter). Contactless flow sensors (e.g., ultrasound or induction) have also been used.

SUMMARY AND DESCRIPTION

The present embodiments may obviate one or more of the drawbacks or limitations in the related art. For example, the cooling water supply in an imaging system may be optimized.

BRIEF DESCRIPTION OF THE DRAWINGS

FIG. 2 shows a top view of one embodiment of a body coil that includes cooling water connectors of gradient coils;

FIG. 3a shows an enlarged partial view of the body coil shown in FIG. 2;

FIG. 3b shows an enlarged partial cross-sectional view of the body coil shown in FIG. 3;

FIG. 4 shows two electrodes on a cooling line for one embodiment of a gradient coil; and FIG. 5 shows two pairs of electrodes on a cooling line for one embodiment of a gradient coil.

DETAILED DESCRIPTION OF THE DRAWINGS

Figure 1:
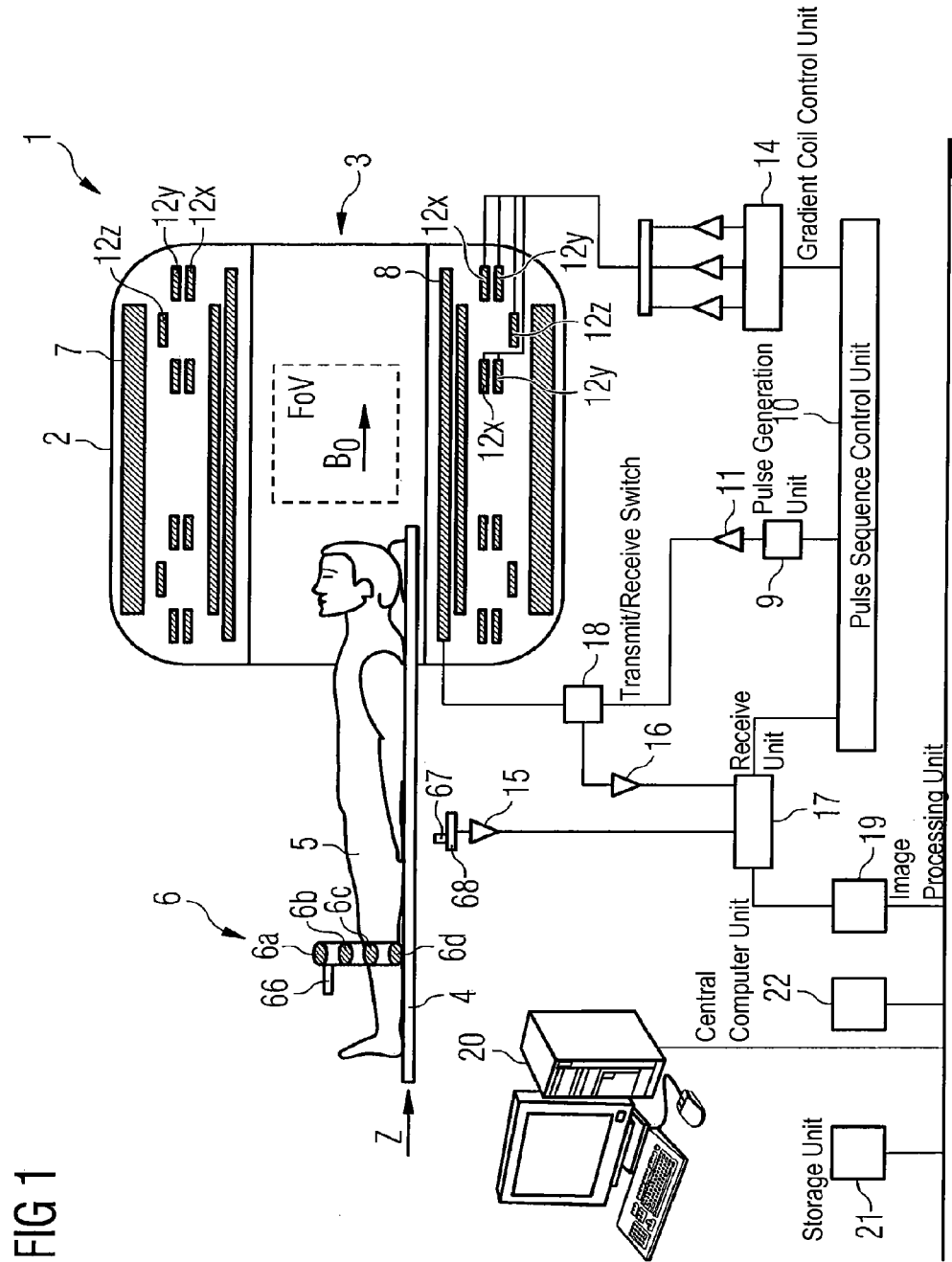
FIG. 1 shows a schematic diagram of an MRT system.

FIG. 1 shows a magnetic resonance imaging device 1 (MRT 1) having a whole body coil 2 with a tubular chamber 3, into which a patient couch 4 holding the body of a patient 5 (with or without local coil arrangement 6), for example may be moved in the direction of the arrow z, to generate recordings of the patient 5. The local coil arrangement 6 is positioned on the patient 5 in FIG. 1 to allow good quality recordings in a local region (e.g., field of view (FoV)). Signals from the local coil arrangement 6 may be evaluated by an evaluation system (e.g., elements 67, 66, 15, 17) of the MRT 1 that may be connected by coaxial cable or radio, for example, to the local coil arrangement 6 (e.g., being converted to images and stored or displayed).

In order to examine a body (e.g., an examination object or the body of the patient 5) with the magnetic resonance device MRT 1 using magnetic resonance imaging, different magnetic fields are radiated onto the body 5, the magnetic fields having time and space characteristics that are aligned with one another. A powerful magnet (e.g., a cryomagnet 7) in a measuring cabinet with tubular chamber 3, generates a powerful static main magnetic field $B_0$ of, for example, 0.2 Tesla to 3 or more Teslas. The body 5 to be examined supported on the patient couch 4 is moved into a fairly homogeneous region of the main magnetic field B0 in the field of view FoV. Excitation of the nuclear spin of atomic nuclei of the body 5 is brought about by magnetic high-frequency excitation pulses, which are radiated in by way of a high-frequency antenna (e.g., a body coil 8 as shown in a simplified manner in FIG. 1 and/or a local coil arrangement). High-frequency excitation pulses are generated, for example, by a pulse generation unit 9, which is controlled by a pulse sequence control unit 10. After amplification by a high-frequency amplifier 11, the high-frequency excitation pulses are conducted to the high-frequency antenna 8. The high-frequency system shown in FIG. 1 is only outlined schematically. More than one pulse generation unit 9, more than one high-frequency amplifier 11 and a number of high-frequency antennas 8 may be used in the magnetic resonance device 1.

The magnetic resonance device 1 also has gradient coils 12x, 12y, 12z, which are used during a measurement to radiate in magnetic gradient fields for selective layer excitation and local coding of the measurement signal. The gradient coils 12x, 12y, 12z are controlled by a gradient coil control unit 14, which like the pulse generation unit 9, is connected to the pulse sequence control unit 10.

The signals transmitted by the excited nuclear spins are received by the body coil 8 and/or at least one local coil arrangement 6, amplified by assigned high-frequency preamplifiers 16 and further processed and digitized by a receive unit 17. The recorded measurement data is digitized and stored as complex numerical values in a k-space matrix. An associated MR image may be reconstructed using a multidimensional Fourier transformation from the k-space matrix populated with values.

In the case of a coil that may be operated both in transmit and receive mode (e.g., the body coil 8), correct signal forwarding is regulated by an upstream transmit/receive switch 18.

An image processing unit 19 uses the measurement data to generate an image that is displayed to a user by way of an operating console 20 and/or stored in a storage unit 21. A central computer unit 22 controls the individual system components.

In MR tomography, images with a high signal-to-noise ratio (SNR) may be recorded using local coil arrangements (e.g., coils or local coils). The local coil arrangements are antenna systems that are located in direct proximity on (anterior) or below (posterior) or in the body. During an MR measurement, the excited nuclei induce a voltage in the individual antennas of the local coil. The induced voltage is amplified using a low-noise preamplifier (e.g., LNA or preamp) and forwarded to the electronic receive system. High field systems are used (e.g., 1.5 T and more) to improve the signal-to-noise ratio even with high-resolution images. Since more individual antennas may be connected to an MR receive system than there are receivers, a switching matrix (e.g., RCCS) is integrated between the receive antennas and the receivers. This routes the active receive channels (e.g., receive channels directly in the field of view of the magnet) to the receivers present. Thus, more coil elements may be connected than there are receivers present, since with whole body coverage, only the coils in the FoV or in the homogeneity volume of the magnet are read.

The local coil arrangement 6 may be an antenna system that may consist of, for example, one antenna element or an array coil made up of a number of antenna elements 6a, 6b, 6c, 6d (e.g., coil elements). The individual antenna elements are, for example, loop antennas (e.g., loops), or butterfly or saddle coils. The local coil arrangement 6 includes, for example, coil elements, a preamplifier, further electronic units (e.g., baluns), a housing, supports and a cable with plug, which may be used to connect the local coil arrangement to the MRT system 1. A receiver 68 positioned on the system side filters and digitizes a signal received by the local coil arrangement 6 by radio, for example, and transfers the data to a digital signal processor. The digital signal processor may derive an image or spectrum from the data obtained by a measurement and makes the image or spectrum available to the user, for example, for subsequent diagnosis or storage.

The present embodiments relate to a magneto-inductive flow sensor, which with a Hall voltage measurement, allows precise flow measurement in an efficient manner in individual cooling planes of a gradient coil (GC). An individual cooling plane of a gradient coil arrangement may be, for example, a plane, in which a gradient system part for an axis is disposed (e.g., an individual cooling plane for the x-axis gradient system and an individual cooling plane for the y-axis gradient system).

The principle of the Hall effect utilized with the present embodiments is as follows:

The force $F=q*v*B$ acts on a load q moving in a uniform manner with the velocity v in the magnetic field B (e.g., in the magnetic field in the z-direction Bz).

For a flat conductor of area b*d in a magnetic field Bz perpendicular to the area Bz, the Hall voltage $Uh=Rh*Ix*Bz/d$ (Rh=Hall constant) may be measured at the edges of the conductor parallel to the direction of the current Ix.

If the conductor is replaced by a tube, through which a conductive fluid flows and which has a diameter D, the following results for the voltage at the opposing sides of the tube (e.g., magnetic field in z-direction: Bz=const; velocity in x-direction: vx=const, k=constant): $U=k*Bz*D*vx$.

The velocity profile in the tube is peripherally symmetrical but is dependent on the distance from the tube wall.

U is therefore approximately proportional to the mean flow velocity of the conductive fluid. The tube diameter is constant. Thus, the measured Hall voltage is proportional to the volume flowing through the tube per unit of time.

What is actually measured is more specifically a line integral over the E-field (i.e., the velocity v over the distance between the electrodes). The throughflow is an integral of v over the cross-sectional area. This produces different weightings depending on the flow profile. The voltage may not to be proportional to the throughflow; different characteristics between laminar/turbulent flow may result. This may be taken into account with tables that, in each instance, assign a value for cooling water volume per unit of time to a measured Hall voltage, the tables being established once for different cooling water volumes per unit of time using a conventional measuring sensor on a cooling line, and stored.

The Hall effect may be applied to MR gradient coils, as follows: Water connectors of gradient coils are located in proximity to windings of the basic field magnet of the MRT 1. The field distribution in this region is known precisely and may be on the order of 0.5 Tesla to a number of Teslas. The orientation of a measurement tube KA3 is selected to be perpendicular to a dominant magnetic field component (e.g., the magnetic field in z-direction: Bz). The voltage proportional to the flow may be measured with the aid of two electrodes E1, E2 integrated in the measurement tube KA3. In one embodiment, the electrodes are attached by adhesion opposite one another on a suitable piece of a plastic tube of the water cooling system or the water connectors, and the measurement cable is disposed in the gradient coil.

Interfering influences: In the case of a non-homogenous magnetic field, a calibration measurement may be taken in the homogeneous magnet center. Interfering DC voltages (e.g., due to electrolysis effects) may be compensated for by differential measurement at two measurement points, as shown in FIG. 5.

One embodiment of a magneto-inductive flow sensor allows precise flow measurement of each individual cooling plane of a gradient coil at low cost. Possible advantages are a precise measurement method, low costs and the possibility of measuring a primary circuit and a secondary circuit of the GC cooling system separately.

FIG. 2 shows a top view of a body coil 2 that includes cooling water connectors of gradient coils on an end face of the body coil 2.

FIG. 3 shows an enlarged view of the body coil 2 of FIG. 2.

FIG. 4 shows two electrodes on a cooling line for a gradient coil for measuring a Hall voltage on the cooling line.

Two electrodes E1, E2 are attached to a tube R on opposing sides of the tube R. In a magnetic field B (e.g., B0) generated by the imaging system, water W flowing through the tube R triggers a Hall voltage U in a voltage measurement device M, the Hall voltage U being a function of the tube cross section and the cooling water velocity (and therefore, the cooling water volume flowing through per unit of time). A computer (e.g., 10) of the imaging system 1 may use the Hall voltage U to determine the volume per unit of time (absolute or relative to a previously measured calibration value).

FIG. 5 shows two pairs E3, E4 and E5, E6 of electrodes, each pair of electrodes E3, E4 and E5, E6 being on a cooling line KA1 and KA2 of a gradient coil system. A voltage U1 between the pair E3, E4 of electrodes represents the cooling water throughflow (e.g., volume per unit of time) through a cooling line KA3 (e.g., of the x-gradient system) in the position, in which the electrodes E3, E4 are disposed.

The voltage U2 between the pair E5, E6 of electrodes represents the cooling water throughflow through the cooling line in the position, in which the electrodes E5, E6 are disposed.

Measuring the two voltages U1 and U2 allows compensation for errors.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A gradient system cooling water measurement system for a gradient system of an imaging system, the cooling water measurement system comprising:
a voltage measurement system operable to measure a Hall voltage, a volume of cooling water flowing through a gradient system cooling water tube of the gradient system per unit of time being determinable based on the measured Hall voltage.

2. The gradient system cooling water measurement system as claimed in claim 1, wherein the voltage measurement system is connected to a gradient system cooling water tube, the voltage measurement system being operable to measure a Hall voltage generated by cooling water flowing through the gradient system cooling water tube in a magnetic field generated by the imaging system.

3. The gradient system cooling water measurement system as claimed in claim 1, wherein the voltage measurement system comprises two electrodes that are connected or are connectable in two positions to the gradient system cooling water tube to measure the Hall voltage, and
wherein the two positions are cross-sectionally opposing positions of the gradient system cooling water tube.

4. The gradient system cooling water measurement system as claimed in claim 3, wherein the two electrodes of the voltage measurement system are disposed, such that a connecting line of the two electrodes is angled toward a direction of a magnetic field generated by the imaging system by more than zero degrees.

5. The gradient system cooling water measurement system as claimed in claim 1, wherein the voltage measurement system comprises at least two pairs of electrodes, the at least two pairs of electrodes operable to measure a Hall voltage between two electrodes of the two pairs, the two pairs of electrodes being disposed in different positions on or in the gradient system cooling water tube.

6. The gradient system cooling water measurement system as claimed in claim 1, wherein the voltage measurement system comprises a plurality of pairs of electrodes, pairs of electrodes of the plurality of pairs of electrodes being disposed on different gradient system cooling water tubes, in a different individual cooling plane of the imaging system, or on different gradient system cooling water tubes and in a different individual cooling plane of the imaging system.

7. The gradient system cooling water measurement system as claimed in claim 1, further comprising a computer system configured to determine a cooling water throughflow volume that flows through the gradient system cooling water tube per unit of time from the measured Hall voltage by multiplication by a stored calibration value.

8. The gradient system cooling water measurement system as claimed in claim 7, wherein the computer system is configured to establish the calibration value by determining the cooling water throughflow volume flowing in a unit of time at the measured Hall voltage.

9. The gradient system cooling water measurement system as claimed in claim 8, wherein the computer system is configured to compare a variable in the form of the measured Hall voltage with a stored reference value to determine how large the variable is relative to the stored reference value.

10. An imaging system comprising:
a gradient system cooling water measurement system, the cooling water measurement system comprising:
a voltage measurement system operable to measure a Hall voltage, a volume of cooling water flowing through a gradient system cooling water tube of the gradient system per unit of time being determinable based on the measured Hall voltage.

11. A method for measuring a variable representing a cooling water throughflow volume in a cooling system of a gradient system of an imaging system, the method comprising:
measuring a Hall voltage using a measurement system connected to a gradient system cooling water tube, a volume of cooling water flowing through the gradient system cooling water tube per unit of time being determinable based on the measured Hall voltage.

12. The method as claimed in claim 11, wherein the measuring comprises measuring a Hall voltage generated by cooling water flowing through the gradient system cooling water tube in a magnetic field generated by the imaging system.

13. The method as claimed in claim 11, wherein the measuring comprises connecting a pair of electrodes of the measurement system to the gradient system cooling water tube in two cross-sectionally opposing positions of the gradient system cooling water tube.

14. The method as claimed in claim 13, wherein connecting the pair of electrodes comprises disposing the pair of electrodes of the measurement system, such that that a connecting line of the pair of electrodes is angled toward a direction of a magnetic field generated by the imaging system by more than zero degrees.

15. The method as claimed in claim 11, wherein the measuring comprises disposing at least two pairs of electrodes of the measurement system on or in the gradient system cooling water tube, the Hall voltage being measured between two electrodes of the at least two pairs.

16. The method as claimed in claim 11, further comprising:
disposing a plurality of pairs of electrodes of the measurement system on different gradient system cooling water tubes to measure Hall voltages between pairs of electrodes of the plurality of pairs of electrodes, the different gradient system cooling water tubes including the gradient system cooling water tube; and
determining a variable representing an overall cooling water volume of the gradient system per unit of time by adding variables representing cooling water volume in the different gradient system cooling water tubes.

17. The method as claimed in claim 12, further comprising determining a cooling water throughflow volume over time flowing within a unit of time through the gradient system cooling water tube from the measured Hall voltage by multiplication by a stored calibration value.

18. The method as claimed in claim 17, further comprising determining the calibration value by determining the cooling water throughflow volume flowing in a unit of time at the measured Hall voltage.

19. The method as claimed in claim 11, further comprising comparing a variable in the form of the measured Hall voltage with a stored reference value to determine how large the variable is relative to the stored reference value.

20. The method as claimed in claim 11, further comprising calculating a cooling water volume flowing per unit of time through the gradient system cooling water tube of the gradient system from the measured Hall voltage.

21. The method as claimed in claim 11, further comprising measuring a Hall voltage with the measurement system in each individual cooling plane of a gradient coil arrangement.

* * * * *